United States Patent
Pitney et al.

(10) Patent No.: US 9,401,271 B2
(45) Date of Patent: Jul. 26, 2016

(54) SUSCEPTOR ASSEMBLIES FOR SUPPORTING WAFERS IN A REACTOR APPARATUS

(71) Applicant: SunEdison Semiconductor Limited (UEN201334164H), Singapore (SG)

(72) Inventors: John Allen Pitney, St. Peters, MO (US); Manabu Hamano, Utsunomiya (JP)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 422 days.

(21) Appl. No.: 13/838,284

(22) Filed: Mar. 15, 2013

(65) Prior Publication Data
US 2013/0276695 A1 Oct. 24, 2013

Related U.S. Application Data

(60) Provisional application No. 61/635,436, filed on Apr. 19, 2012.

(51) Int. Cl.
| | |
|---|---|
| *C30B 25/12* | (2006.01) |
| *H01L 21/02* | (2006.01) |
| *C30B 25/10* | (2006.01) |
| *C30B 25/16* | (2006.01) |
| *C23C 16/458* | (2006.01) |
| *H01L 21/687* | (2006.01) |

(52) U.S. Cl.
CPC ...... *H01L 21/02104* (2013.01); *C23C 16/4584* (2013.01); *C30B 25/10* (2013.01); *C30B 25/12* (2013.01); *C30B 25/16* (2013.01); *H01L 21/68785* (2013.01)

(58) Field of Classification Search
CPC ........ C30B 23/00; C30B 23/02; C30B 23/06; C30B 23/063; C30B 25/00; C30B 25/02; C30B 25/10; C30B 25/12; C23C 16/00; C23C 16/458; C23C 16/4581; C23C 16/4582; C23C 16/4583; C23C 16/4584; C23C 16/4585; C23C 16/4586; Y10T 117/00; Y10T 117/10; Y10T 117/1004; Y10T 117/1008
USPC .................. 117/84–86, 88, 94, 98, 106–107, 117/200–202, 911
See application file for complete search history.

(56) References Cited

U.S. PATENT DOCUMENTS

| | | |
|---|---|---|
| 5,710,407 A | 1/1998 | Moore et al. |
| 6,444,027 B1 | 9/2002 | Yang et al. |
| 6,569,239 B2 | 5/2003 | Arai et al. |
| 6,596,095 B2 | 7/2003 | Ries et al. |
| 6,652,650 B2 | 11/2003 | Yang et al. |

(Continued)

FOREIGN PATENT DOCUMENTS

| | | |
|---|---|---|
| EP | 1287188 B1 | 3/2007 |
| JP | 2005-260095 A | 9/2005 |

OTHER PUBLICATIONS

PCT International Search Report and Written Opinion of the International Searching Authority mailed on Jul. 19, 2013 regarding PCT/US2013/036381 filed on Apr. 12, 2013; 9 pgs.

*Primary Examiner* — Kenneth A Bratland, Jr.
(74) *Attorney, Agent, or Firm* — Armstrong Teasdale LLP (57) ABSTRACT

Apparatus and methods for wafer processes such as etching and chemical vapor deposition processes are disclosed. In some embodiments, the apparatus includes a susceptor and a ring disposed beneath the susceptor to influence a thickness of the deposited epitaxial layer.

20 Claims, 8 Drawing Sheets

(56) References Cited

U.S. PATENT DOCUMENTS

| | | |
|---|---|---|
| 7,393,417 B1 | 7/2008 | Maeda et al. |
| 2001/0037761 A1 | 11/2001 | Ries et al. |
| 2003/0015141 A1* | 1/2003 | Takagi ................ C23C 16/4585 118/728 |
| 2004/0077184 A1* | 4/2004 | Anderson ............. C23C 16/402 438/787 |
| 2005/0016466 A1* | 1/2005 | Scudder .............. C23C 16/4585 118/728 |
| 2007/0095799 A1 | 5/2007 | Matsuzawa et al. |
| 2007/0227441 A1 | 10/2007 | Narahara et al. |
| 2009/0165721 A1 | 7/2009 | Pitney |
| 2009/0194024 A1 | 8/2009 | Burrows et al. |
| 2010/0227046 A1 | 9/2010 | Kato et al. |
| 2011/0114017 A1 | 5/2011 | Kimura et al. |
| 2012/0073503 A1 | 3/2012 | Huang et al. |

* cited by examiner

SUSCEPTOR ASSEMBLIES FOR SUPPORTING WAFERS IN A REACTOR APPARATUS

CROSS REFERENCE

This application claims priority to U.S. Provisional Application No. 61/635,436 filed Apr. 19, 2012, the disclosure of which is hereby incorporated by reference in its entirety.

FIELD

The field relates generally to apparatus and methods for wafer processing, and more particularly to apparatus and methods for semiconductor wafer etching or semiconductor chemical vapor deposition processes.

BACKGROUND

Epitaxial chemical vapor deposition (CVD) is a process for growing a thin layer of material on a semiconductor wafer so that the lattice structure is identical to that of the wafer. Epitaxial CVD is widely used in semiconductor wafer production to build up epitaxial layers such that devices can be fabricated directly on the epitaxial layer. The epitaxial deposition process begins by introducing a cleaning gas, such as hydrogen or a hydrogen and hydrogen chloride mixture, to a front surface of the wafer (i.e., a surface facing away from the susceptor) to pre-heat and clean the front surface of the wafer. The cleaning gas removes native oxide from the front surface, permitting the epitaxial silicon layer to grow continuously and evenly on the surface during a subsequent step of the deposition process. The epitaxial deposition process continues by introducing a vaporous silicon source gas, such as silane or a chlorinated silane, to the front surface of the wafer to deposit and grow an epitaxial layer of silicon on the front surface. A back surface opposite the front surface of the susceptor may be simultaneously subjected to hydrogen gas. The susceptor, which supports the semiconductor wafer in the deposition chamber during the epitaxial deposition, is rotated during the process to allow the epitaxial layer to grow evenly.

However, epitaxial CVD growth rates are generally not uniform across the surface of each wafer. A lack of uniformity causes degradation in the flatness of the wafer. The lack of uniformity may be a result of issues in the flow velocity, local temperature deviations, or both. Accordingly, there exists a need for a practical apparatus to improve local temperature deviations to improve uniformity of epitaxial CVD growth rates.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a susceptor assembly for supporting a semiconductor wafer during a wafering process in a reaction apparatus. The susceptor assembly includes a susceptor having opposing upper and lower surfaces. The upper surface of the body is sized and shaped for supporting a semiconductor wafer therein during the process. The susceptor assembly also includes a ring disposed below the lower surface of the susceptor.

Another aspect of the present disclosure is directed to a method for adjusting the thickness profile of a layer deposited on wafers. The layer is deposited by deposition in a reaction apparatus having a susceptor. A layer is deposited on a wafer in the reaction apparatus. The thickness profile of the layer is measured. A thickness profile of the layer is analyzed to determine the radial location of a thickness non-uniformity in the thickness profile. A ring is disposed below the susceptor at a radial location that corresponds to the thickness non-uniformity in the thickness profile to increase or decrease the thickness of the layer in subsequently produced wafers.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
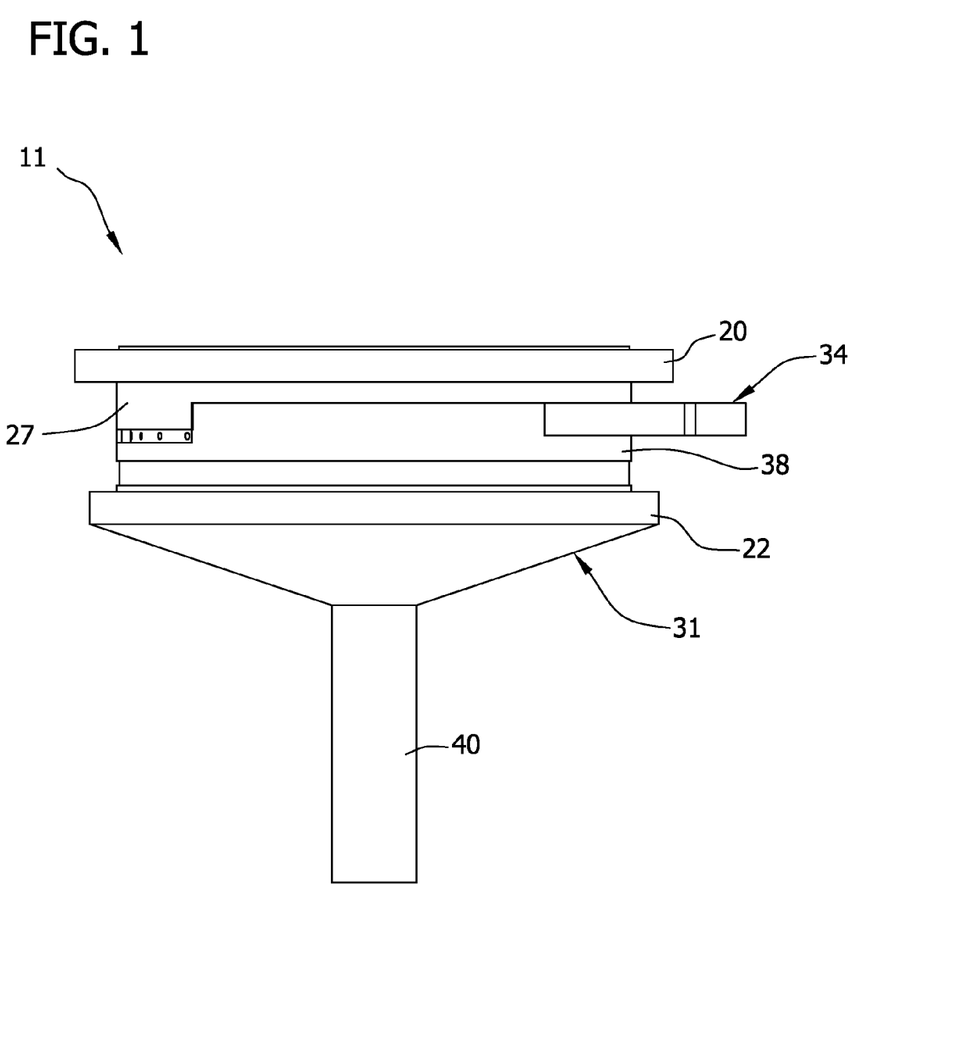
FIG. 1 is a front view of an apparatus for processing a substrate such as a semiconductor wafer.
Figure 2:
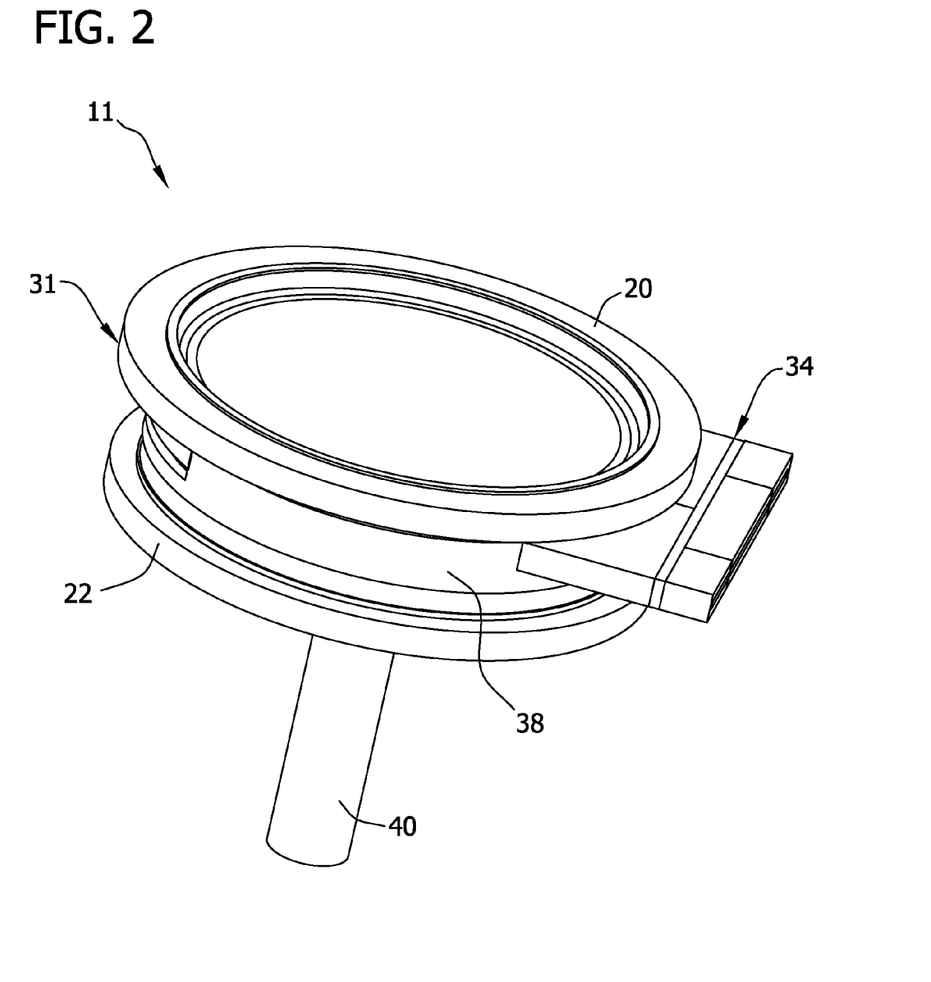
FIG. 2 is a perspective view of the apparatus.

Referring now to FIG. 1, an apparatus for etching a semiconductor wafer or for depositing an epitaxial layer on a semiconductor substrate in accordance with an embodiment of the present disclosure is generally referred to as 11. The illustrated apparatus is a single wafer reactor; however, the apparatus and methods disclosed herein for providing a more uniform epitaxial layer are suitable for use in other reactor designs including, for example, multiple wafer reactors. The apparatus 11 includes a reaction chamber 31 comprising an upper dome 20, a lower dome 22, an upper liner 27, and a lower liner 38. Collectively, the upper dome 20, lower dome 22, upper liner 27, and lower liner 38 define an interior space of the reaction chamber 31 in which process gas contacts the semiconductor wafer. A gas manifold 34 is used to direct process gas into the reaction chamber 31. A perspective view of the reaction chamber 31 and gas manifold 34 is shown in FIG. 2.

The apparatus 11 may be used to process a wafer, including without limitation, depositing any type of material on a wafer by a chemical vapor deposition (CVD) process, such as epitaxial CVD or polycrystalline CVD. In this regard, reference herein to epitaxy and/or CVD processes should not be considered limiting as the apparatus 11 may also be used for other purposes such as to perform etching or smoothing processes on the wafer. Also, the wafer shown herein is generally circular in shape, though wafers of other shapes are contemplated within the scope of this disclosure.

Figure 3:
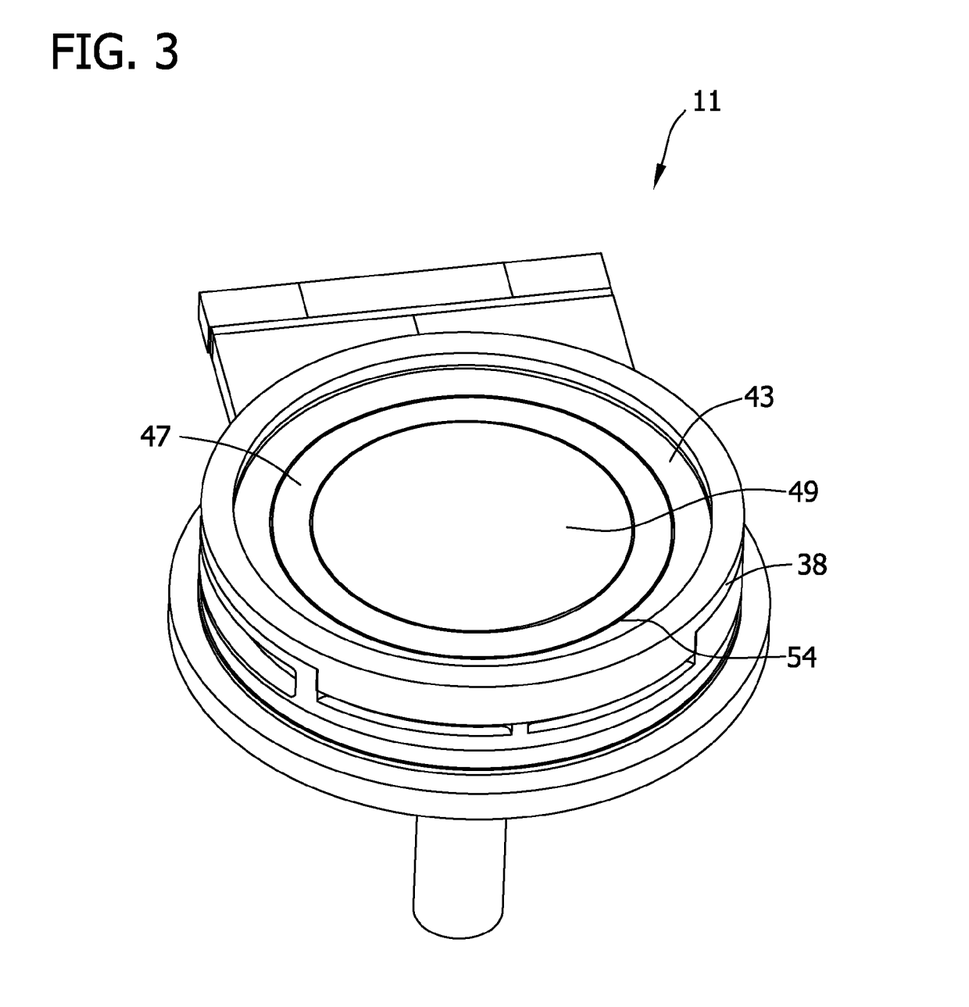
FIG. 3 is a perspective view of the apparatus with the upper dome removed.

The apparatus 11 is shown in perspective with the upper dome 20 removed to better illustrate the apparatus in FIG. 3. Within the interior space of the reaction chamber 31 is a preheat ring 43 for heating the process gas prior to contact with a semiconductor wafer 49. The outside circumference of the preheat ring 43 is attached to the inner circumference of the lower liner 38. For example, the preheat ring 43 may be supported by an annular ledge (not shown) of the lower liner 38. A susceptor 47 (which may also be referred to herein as a "susceptor body") traversing the space interior to the preheat ring 43 supports a semiconductor wafer 49.

Process gas may be heated prior to contacting the semiconductor wafer 49. Both the preheat ring 43 and the susceptor 47 are generally opaque to absorb radiant heating light produced by high intensity radiant heating lamps (not shown) that may be located above and below the reaction chamber 31. Maintaining the preheat ring 43 and the susceptor 47 at a temperature above ambient allows the preheat ring 43 and the susceptor to transfer heat to the process gas as the process gas passes over the preheat ring and the susceptor. Typically, the diameter of the wafer 49 is less than the diameter of the susceptor 47 to allow the susceptor to heat the process gas before it contacts the wafer.

The preheat ring 43 and susceptor 47 may suitably be constructed of opaque graphite coated with silicon carbide, though other materials are contemplated. The upper dome 20 and lower dome 22 are typically made of a transparent material to allow radiant heating light to pass into the reaction chamber 31 and onto the preheat ring 43 and the susceptor 47. The upper dome 20 and lower dome 22 may be constructed of transparent quartz. Quartz is generally transparent to infrared and visible light and is chemically stable under the reaction conditions of the deposition reaction. Equipment other than high intensity lamps (not shown) may be used to provide heat to the reaction chamber such as, for example, resistance heaters and inductive heaters. An infrared temperature sensor (not shown) such as a pyrometer may be mounted on the reaction chamber 31 to monitor the temperature of the susceptor 47, preheat ring 43, or semiconductor wafer 49 by receiving infrared radiation emitted by the susceptor, preheat ring, or wafer.

Figure 4:
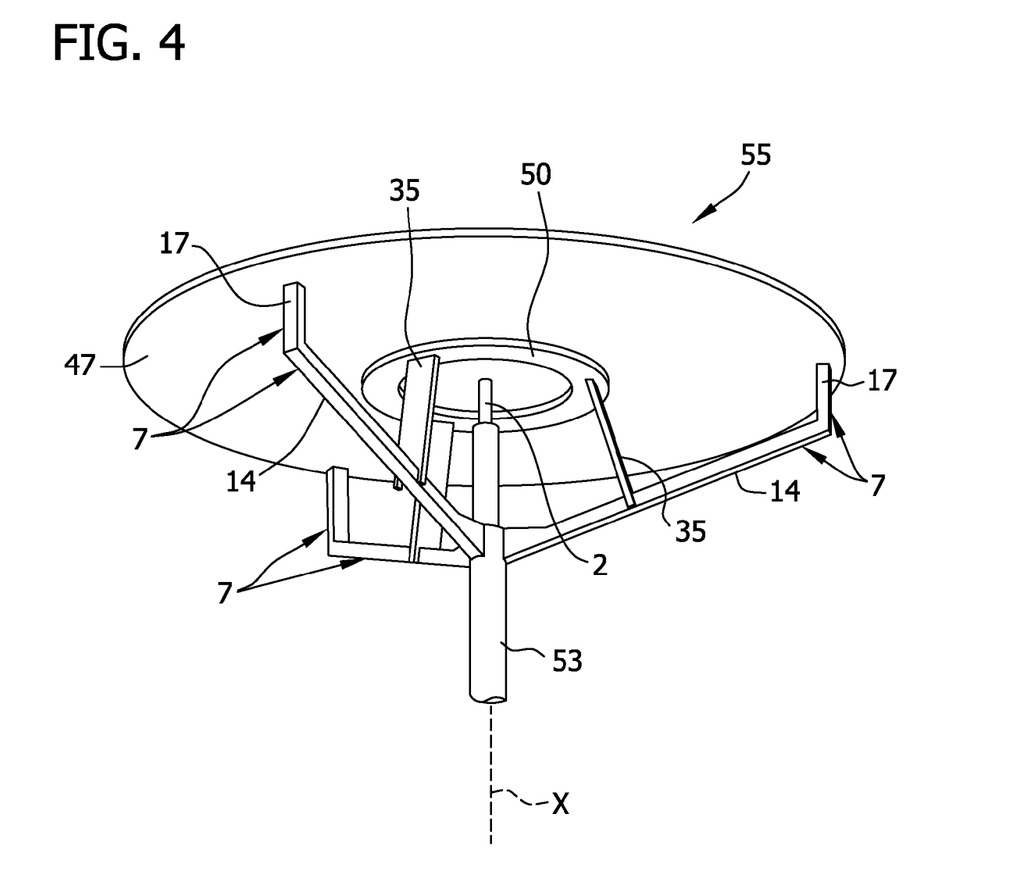
FIG. 4 is a perspective view of the apparatus with some components including the upper dome, lower dome and pre-heat ring removed.

Referring now to FIG. 4, wherein some components of the apparatus 11 are removed to better illustrate the apparatus, the apparatus 11 includes a susceptor assembly 55 that includes the susceptor 47 and a ring 50 disposed beneath the susceptor 47. The susceptor 47 is attached to susceptor supporting members 7 that extend upward from a shaft 53. The shaft 53 extends through a central column 40. Each susceptor supporting member 7 includes an arm 14 extending outward from the shaft 53 and a vertical leg 17 attached to the susceptor 47. In some embodiments (not shown), the susceptor supporting members 7 extend directly to the susceptor 47 (i.e., do not include a separate vertical leg 17).

The shaft 53 is connected to a suitable rotation mechanism (not shown) for rotation of the shaft 53, susceptor 47, and wafer 49 about a longitudinal axis X of the apparatus 11. The outside edge of the susceptor 47 and inside edge of the preheat ring 43 (FIG. 3) are separated by a gap 54 to allow rotation of the susceptor. The wafer 49 is rotated to prevent an excess of material from being deposited on the wafer leading edge and provide a more uniform epitaxial layer. The apparatus 11 includes a central post 2 that extends from the shaft 53 to support the susceptor 47. In some embodiments (not shown), the apparatus 11 does not include a central post 2 (or includes a central post that does not contact the susceptor).

The susceptor 47 shown in FIGS. 1-4 is merely an example. In other embodiments, the susceptor may have other shapes, one or more recesses formed therein, and/or several openings formed in the susceptor. Examples of suitable susceptors for use in accordance with the present disclosure are described in U.S. Pat. Nos. 6,652,650; 6,596,095; and 6,444,027 and European Patent No. 1 287 188 B1.

In some embodiments, the susceptor 47 is a disk that has a lower surface, and an upper surface with a recess of the susceptor for receiving the wafer 49. In addition, suitable receivers may be included in the susceptor for receiving a support. For example, three equally spaced, race-track-shaped openings (not shown) may extend into the susceptor from the lower surface for receiving the upper ends of susceptor supporting members 7 disposed within the reaction chamber 31. These support openings engage the supporting members 7 to prevent the susceptor from slipping on the supports as they turn during processing. Alternatively, the susceptor 47 may include support bosses that are sized and shaped for receiving the supporting members 7 as disclosed in U.S. Patent Publication No. 2009/0165721. Alternatively, the susceptor supporting members 7 and/or central post 2 may be attached to the susceptor 47 by use of lift pins (e.g., silicon carbide lift pins) that extend through the lower surface of the susceptor 47 into the vertical legs 17 and/or central post 2.

The ring 50 is attached to ring supporting members 35. The ring supporting members 35 extend from the arms 14 of the susceptor supporting members 7. The ring supporting members 35 may suitably extend from other portions of the susceptor assembly 55 such as the central shaft 35. In other embodiments (not shown), the ring may suitably be mounted in other ways, such as by attachment to an open ended cylinder that extends downward to the susceptor supporting members 7 or by use of a downward-facing cone that extends from the ring to the central shaft 53.

The ring 50 is suitably made of a transparent material (e.g., quartz) to allow visible and infrared light to pass through the ring. In other embodiments, the ring may be made of a translucent material. In other embodiments, the ring may have a transparent first portion and a translucent second portion, among other possible combinations. Generally, the ring 50 corrects, affects, or modulates the radial temperature profile of the wafer during processing, such as epitaxial deposition to alleviate non-uniformities. The ring may cause the temperature of the portion of the wafer above the ring to increase (relative to when a ring is not used) thereby increasing the amount of material (e.g., silicon) that deposits in a region of the wafer during epitaxial CVD processes. Accordingly, the ring is suitably disposed below regions of the wafer in which a localized or global minimum layer thickness occurs to increase the deposition at this region and create a more uniform radial deposition profile. Note that this minimum layer thickness may be a local or global minimum, and may generally be referred to as a non-uniformity.

In some embodiments, rather than being transparent, the ring 50 is translucent to provide local cooling to the wafer and decrease any local or global maximum epitaxial layer thickness.

Figure 5:
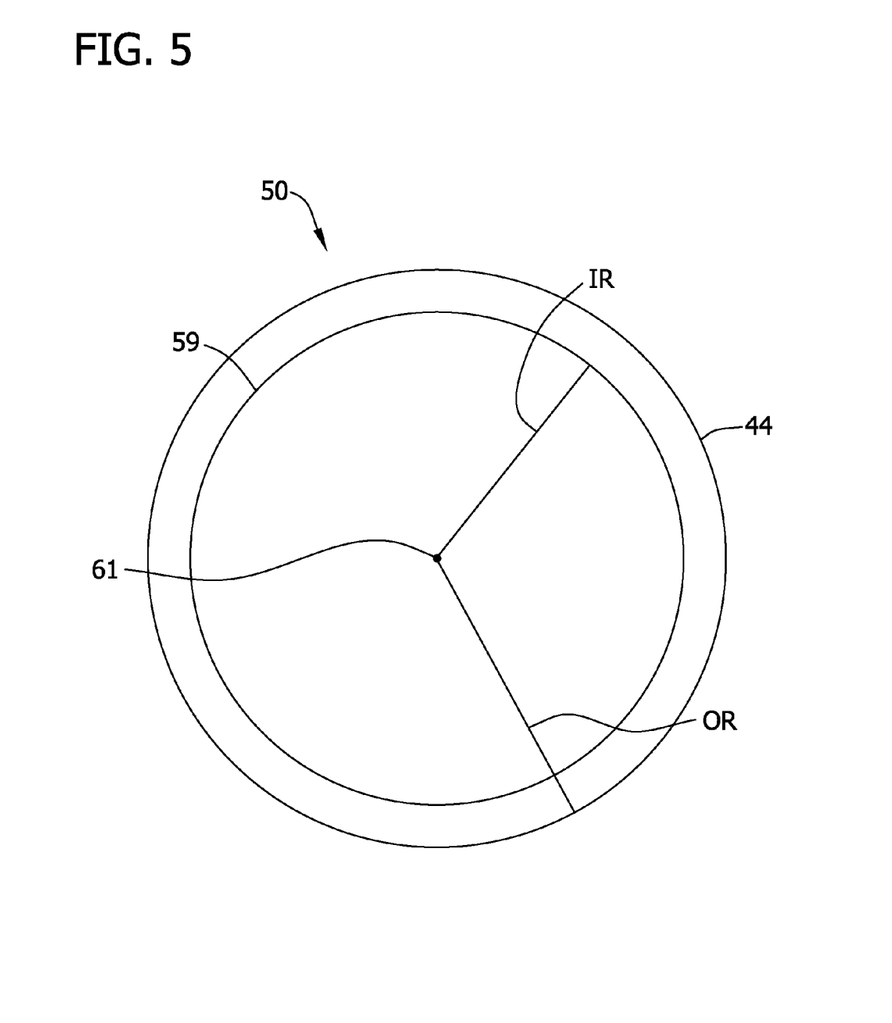
FIG. 5 is a top view of a ring of the apparatus.

Referring now to FIG. 5, the ring 50 has an outer edge 44, inner edge 59, and center 61. The ring 50 has an inner radius IR extending from the center 61 of the ring to the inner edge 59 and an outer radius OR extending from the center 61 of the ring to the outer edge 44. The inner radius and outer radius are suitably chosen depending on the location and width of a local or global epitaxial layer thickness minimum or maximum.

As described in Example 1 below, it may be desirable to mitigate the minimum epitaxial layer thickness that may occur at about 50 mm from the center of the wafer during deposition of silicon on a silicon wafer. Accordingly, in some embodiments, the ring 50 has an inner radius that is less than about 50 mm, less than about 46 mm, less than about 42 mm, or less than about 38 mm; and an outer radius that is at least about 48 mm, at least about 50 mm, at least about 54 mm, at least about 58 mm, or at least about 62 mm such that the ring 50 is located below the wafer near or at the 50 mm global minimum.

The distance between the ring 50 and the susceptor 47 (i.e., from the lowest point of the susceptor if the susceptor does not have a uniform lower surface) that is less than about 100 mm, less than about 75 mm, less than about 50 mm, less than about 25 mm, less than about 10 mm, less than about 5 mm, or even less than about 1 mm. In these and other embodiments, the distance between the ring and the susceptor (i.e., from the lowest point of the susceptor) is at least about 1 mm, at least about 5 mm, at least about 10 mm, at least about 25 mm, at least about 50 mm, or at least about 75 mm. The distance between the ring 50 and the susceptor 47 may be bound by any combination of this parameters (e.g., from about 5 mm to about 200 mm or from about 25 mm to about 75 mm). Decreasing the distance between the susceptor 47 and the ring 50 generally results in deposition of more material on the wafer in portions of the wafer above the ring and increasing the distance generally results in less deposition. Therefore, the amount of material deposited on portions of the wafer above the ring may be adjusted by varying this distance.

In some embodiments, the ring 50 contacts the lower surface of the susceptor 47. In these embodiments, the ring 50 may optionally be attached to the lower surface of the susceptor 47.

In some embodiments, the outer radius is at least about 20 mm, at least about 40 mm, at least about 60 mm, at least about 80 mm, at least about 100 mm, at least about 200 mm, or at least about 300 mm. In other embodiments, the outer radius may suitably be from about 20 mm to about 300 mm, from about 40 mm to about 300 mm, from about 20 mm to about 200 mm, from about 20 mm to about 100 mm, or from about 40 mm to about 80 mm.

Alternatively or in addition, the inner radius may be at least about 20 mm, at least about 40 mm, at least about 60 mm, at least about 80 mm, at least about 100 mm, at least about 200 mm, at least about 300 mm, from about 20 mm to about 300 mm, from about 40 mm to about 300 mm, from about 20 mm to about 200 mm, from about 20 mm to about 100 mm, or from about 40 mm to about 80 mm. In some embodiments, the ring is a disk without the inner radius (i.e., does not have an opening formed therein). The width of the ring 50 (i.e., the distance between the inner radius and the outer radius) may be at least about 1 mm, at least about 5 mm, at least about 10 mm, at least about 20 mm, at least about 40 mm, at least about 75 mm, at least about 100 mm, at least about 200 mm, from about 1 mm to about 300 mm, from about 1 mm to about 100 mm, from about 10 mm to about 100 mm, or from about 10 mm to about 40 mm.

The ring 50 may have a thickness of at least about 0.5 mm, at least about 1 mm, at least about 2 mm, at least about 4 mm, less than about 10 mm, less than about 6 mm, less than about 4 mm, less than about 2 mm, from about 0.5 mm to about 10 mm, from about 0.5 mm to about 6 mm, from about 2 mm to about 10 mm, or from about 2 mm to about 6 mm).

The ranges recited above for the inner radius and outer radius of the ring 50, the distance between the susceptor and the ring, the ring thickness and the like are exemplary and values outside of the stated ranges may be used without limitation. In some embodiments, more than one ring 50 is used to mitigate more than two local layer thickness problems or non-uniformities. In some embodiments (not shown), the susceptor supporting members 7 extend through the opening of the ring 50 rather than outside the outer edge 44 of the ring.

As shown in FIG. 5, the outer edge 44 of the ring 50 has a substantially uniform circular shape. In other embodiments, the outer edge 44 of the ring 50 may be shaped to include various projections and/or notches or recesses. The outer edge 44 may also be beveled or rounded. Such non-uniform shapes may lessen the effect of the ring 50 on the thickness profile at the outer edge 47 of the ring (i.e., lessens the falloff effect). Alternatively or in addition, the inner edge 59 may have non-uniform shape (e.g., projections and/or notches) and/or may be beveled or rounded.

The susceptor supporting members 7 and ring supporting members 35 may be transparent (e.g., made of quartz) to allow infrared and visible light to pass therethrough). In some embodiments, more than three susceptor supporting members 7 and/or ring supporting members 35 may be used without limitation.

Figure 6:
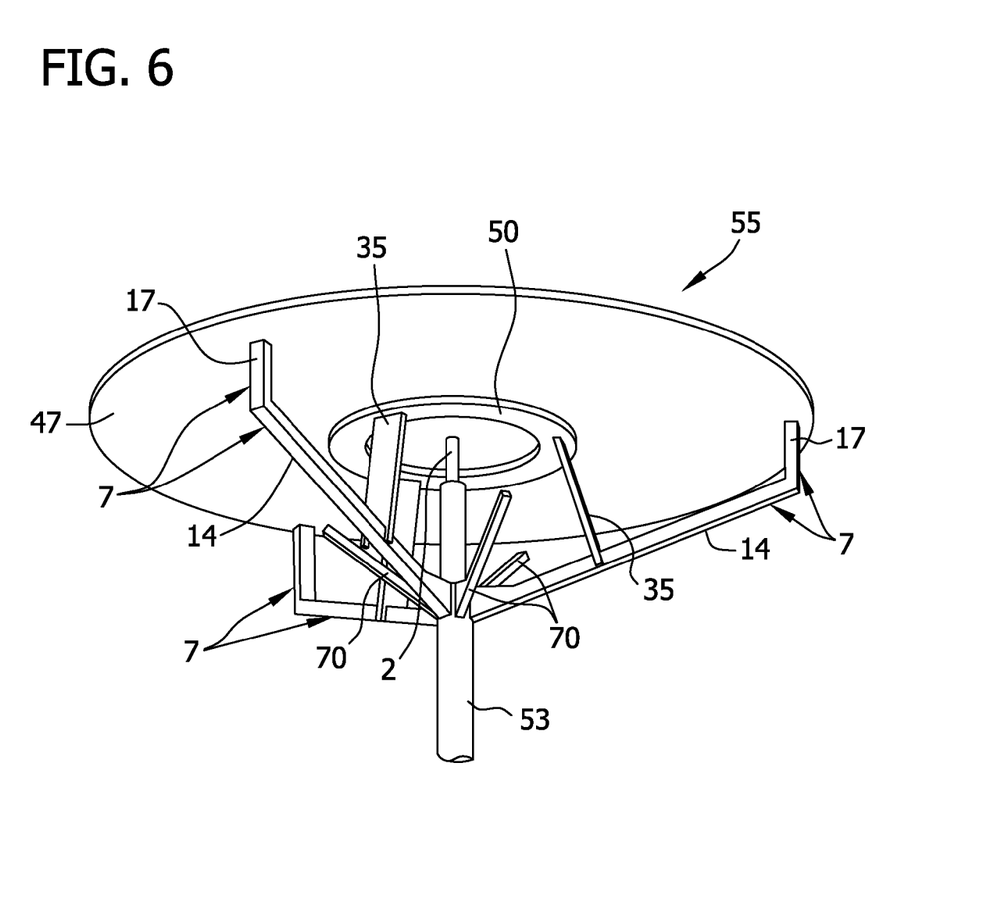
FIG. 6 is a perspective view of a apparatus that includes auxiliary arms with the upper dome, lower dome and pre-heat ring removed.

As shown in FIG. 6, the susceptor assembly 55 includes auxiliary arms 70 that extend from the shaft 53 to the ring 50. The auxiliary arms 70 extend toward the susceptor 47, but are not in contact with the susceptor. In other embodiments (not shown) the auxiliary arms 70 contact the susceptor 47 (in which case the auxiliary arms 70 may be considered to be additional susceptor supporting members 7). The auxiliary arms 70 may counteract a local increase in the epitaxial layer thickness that occurs on portions of the wafer above the arms 14.

In accordance with the present disclosure, the thickness of epitaxial layers (e.g., silicon) deposited on substrates (e.g., single crystal silicon) may be adjusted by use of the apparatus 11 described above. In some embodiments, the thickness profile of one or more epitaxial wafers (e.g., the thickness profile of the entire structure or of the epitaxial layer itself) produced by chemical vapor deposition in a reactor apparatus having a susceptor is determined. The thickness profile is analyzed to determine the radial location of a local or global minimum or maximum thickness. A transparent ring is positioned below the susceptor at a radial location that corresponds to the global or local minimum or maximum thickness in the thickness profile to increase or decrease the thickness of the epitaxial layer at the local or global minimum or maximum. In some embodiments, the ring is fixedly attached to the susceptor assembly or, as in other embodiments, is removably attached.

In this regard, a plurality of wafers may be analyzed to determine the thickness profile and/or an average thickness profile may be generated to determine the radial location of a local or global minimum or maximum thickness in the wafer profile.

The thickness profile may be determined by use of any suitable method available to those of skill in the art including, for example, use of a Fourier-Transform Infrared (FTIR) spectrometer or use of a wafer flatness tool (e.g., KLA-Tencor Wafersight or WaferSight2; Milpitas, Calif.). In some embodiments, the radial thickness profile of the substrate is determined before material deposition (e.g., before deposition of an epitaxial layer) and the thickness profile of the layered structure may then be measured. The thickness profile of the deposited layer may be determined by subtracting the substrate thickness from the layered structure thickness.

Use of the above embodiments positively effects local temperature deviations to improve the uniformity of epitaxial CVD growth on a wafer. Additionally, use of the above embodiments increases the overall production of the epitaxial CVD system, and lowers overall operational costs by reducing waste.

EXAMPLES

The processes of the present disclosure are further illustrated by the following Examples. These Examples should not be viewed in a limiting sense.

Example 1

Determining the Effect of Using Quartz Rings on the Radial Thickness Profile

Two transparent quartz rings were separately tested in an EPI Centura (Applied Materials; Santa Clara, Calif.) single wafer epitaxy tool to determine their effect on the epitaxial wafer thickness profile in 300 mm wafers. The epitaxial wafers were prepared by exposing single crystal silicon wafer produced by the Czochralski method to trichlorosilane gas at a wafer temperature between 1100° C. to 1150° C.

The first ring had an inner diameter of 30 mm and an outer diameter of 50 mm. The second ring had an inner diameter of 40 mm and an outer diameter of 60 mm. The ring supporting members were sized such that the distance between the first ring and the susceptor was 11 mm and the distance between the second ring and the susceptor was 50 mm.

A control run was performed in which a ring was not used. Auxiliary arms were not used in the control run or with the runs which included use of a transparent ring. As can be seen from FIG. 7, the control resulted in an epitaxial wafer radial thickness profile (which is depicted as an offset from the mean thickness) in which a global thickness minimum of about −35 nm occurs at about 52 mm from the center of the wafer. Thickness profiles were measured with a KLA-Tencor Wafersight 2 wafer flatness tool.

Figure 7:
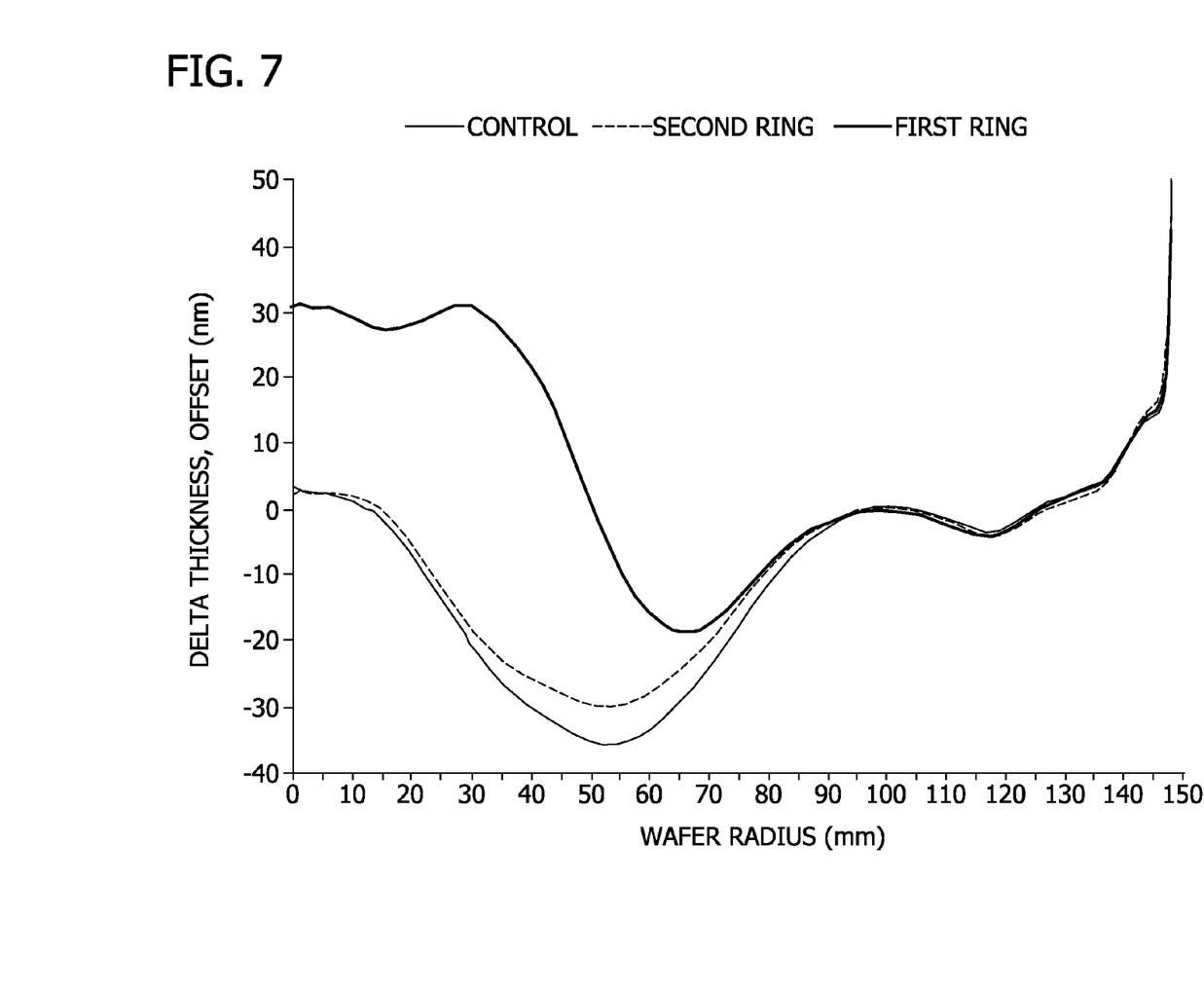
FIG. 7 is a graph showing the radial thickness profiles of epitaxial wafers prepared in accordance with Example 1.

The second ring reduced the local minimum at about 52 mm by about 5 nm thereby improving the thickness uniformity. The first ring reduced the local minimum to about −20 nm. However, the first ring resulted in an offset of +30 nm from the center of the wafer to about 30 mm from the center and degraded the uniformity.

Example 2

Determining the Effect of Using Quartz Rings and Auxiliary Arms on the Radial Thickness Profile A transparent quartz ring and three auxiliary arms were tested in an EPI Centura (Applied Materials; Santa Clara, Calif.) single wafer epitaxy tool to determine their effect on the epitaxial wafer thickness profile in 300 mm wafers prepared according to the process of Example 1. The target epitaxial layer thickness was 2.75 μm. The tested ring had an inner diameter of 45 mm and an outer diameter of 65 mm. The ring supporting members were sized such that the distance between the ring and the susceptor was 25 mm.

The three auxiliary arms were about 80 mm in length (from center) and extended out an angle of about 70° from the vertical axis.

Figure 8:
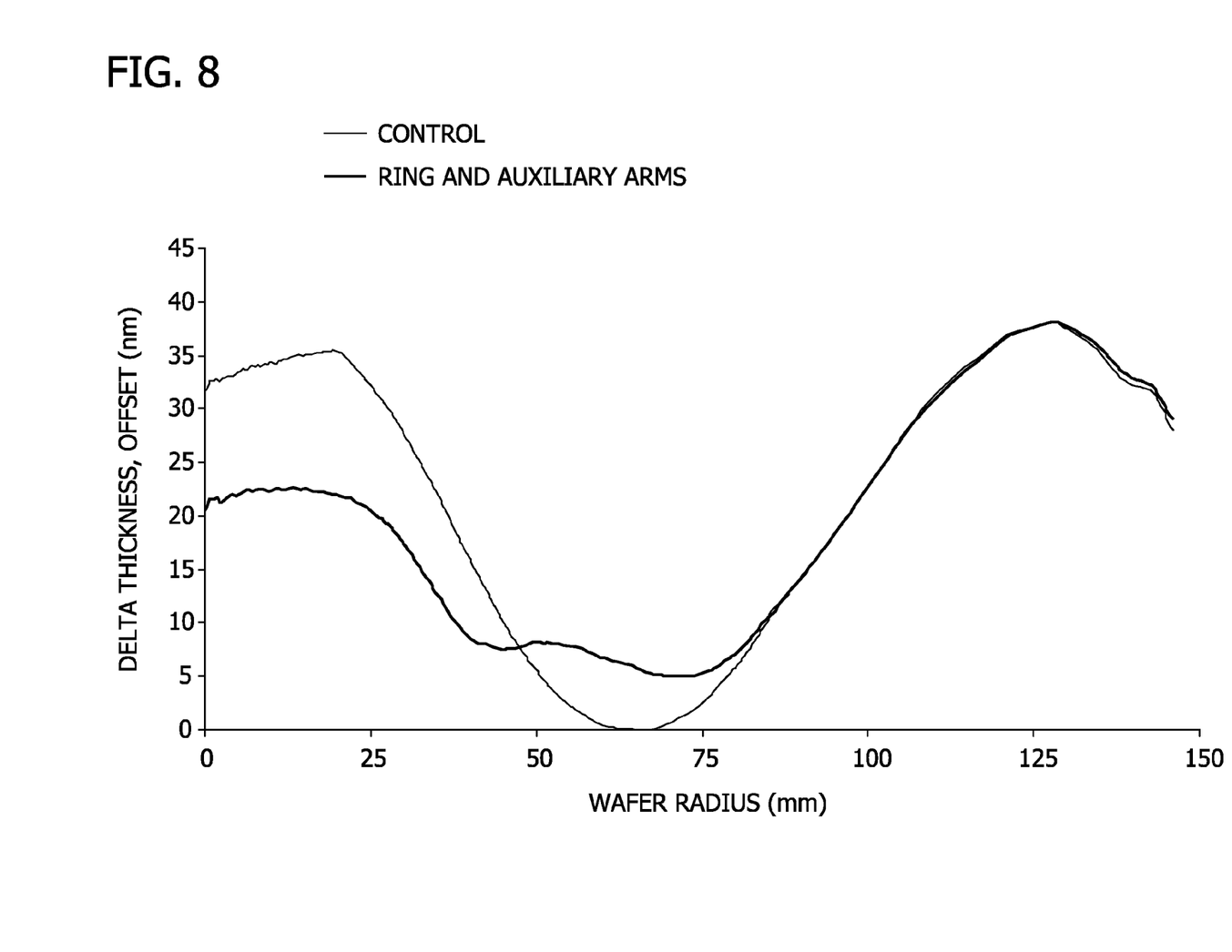
FIG. 8 is a graph showing the radial thickness profiles of epitaxial wafers prepared in accordance with Example 2.

A control run was performed in which a ring and auxiliary arms were not used. As can be seen from FIG. 8, the run with the ring and auxiliary arms resulted in an epitaxial wafer radial thickness profile (which is depicted as an offset) in which the minimum that occurs between 50 mm and 75 mm was reduced by 5 nm relative to the control.

When introducing elements of the present invention or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A susceptor assembly for supporting a semiconductor wafer during a watering process in a reaction apparatus, the susceptor assembly comprising:
   a susceptor having opposing upper and lower surfaces, the upper surface of the body sized and shaped for supporting a semiconductor wafer therein during the process;
   a shalt and a plurality of susceptor supporting members that extend upward between the shaft and the susceptor lower surface to support the susceptor;
   a ring disposed below the lower surface of the susceptor; and
   a plurality of ring supporting members that each extend between one susceptor supporting member of the susceptor supporting members and the ring, wherein the plurality of ring supporting members are positioned below the ring such that the ring is positioned between the plurality of ring supporting members and the susceptor.

2. The susceptor assembly of claim 1 wherein the ring has an outer edge, the outer edge being beveled.

3. The susceptor assembly pf claim 1 wherein the ring has an outer edge, the outer edge being rounded.

4. The susceptor assembly of claim 1 wherein the ring has an outer edge, the outer edge having a series of projections and/or notches formed therein.

5. The susceptor assembly of claim 1, wherein the susceptor is generally opaque to absorb radiant heating light produced by high intensity radiant heating lamps.

6. The susceptor assembly of claim 1, wherein the ring is generally transparent material to allow visible and infrared light to pass through the ring.

7. The susceptor assembly of claim 1, wherein the wafering process is epitaxial chemical vapor deposition.

8. The susceptor assembly of claim 1, further comprising a preheat ring spaced radially outward from the susceptor to allow the susceptor to rotate with respect to the preheat ring.

9. The susceptor assembly of claim 8, wherein the preheat ring is generally opaque to absorb radiant heating light produced by high intensity radiant heating lamps.

10. The susceptor assembly of claim 1, wherein the plurality of ring support members are oriented obliquely with respect to the shaft.

11. The susceptor assembly of claim 1 further comprising a center post that extends axially from the shaft to support the susceptor.

12. A susceptor assembly for supporting a semiconductor wafer during a watering process in a reaction apparatus, the susceptor assembly comprising:
- a susceptor having opposing upper and lower surfaces, the upper surface of the body sized and shaped for supporting a semiconductor wafer therein during the process;
- a shaft and a plurality of susceptor supporting members that extend upward between the shaft and the susceptor lower surface to support the susceptor;
- a ring disposed below the lower surface of the susceptor; and
- a plurality of ring supporting members that each extend between one susceptor supporting member of the susceptor supporting members and the ring, wherein each ring supporting member includes a first end attached to the ring and an opposite second end attached to one of the plurality of susceptor supporting members.

13. The susceptor assembly pf claim 12 wherein the ring has an outer edge, the outer edge being rounded.

14. The susceptor assembly of claim 12, wherein the susceptor is generally opaque to absorb radiant heating light produced by high intensity radiant heating lamps.

15. The susceptor assembly of claim 12, wherein the ring is generally transparent material to allow visible and infrared light to pass through the ring.

16. The susceptor assembly of claim 12, wherein the wafering process includes epitaxial chemical vapor deposition.

17. The susceptor assembly of claim 12, further comprising a preheat ring spaced radially outward from the susceptor to allow the susceptor to rotate with respect to the preheat ring.

18. The susceptor assembly of claim 17, wherein the preheat ring is generally opaque to absorb radiant heating light produced by high intensity radiant heating lamps.

19. The susceptor assembly of claim 12, wherein the susceptor is formed as a one-piece susceptor.

20. The susceptor assembly of claim 1, wherein the susceptor is formed as a one-piece susceptor.

\* \* \* \* \*